(12) United States Patent
Choi

(10) Patent No.: US 6,980,480 B2
(45) Date of Patent: Dec. 27, 2005

(54) MULTI-FREQUENCY SYNCHRONIZING CLOCK SIGNAL GENERATOR

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/835,361

(22) Filed: Apr. 28, 2004

(65) Prior Publication Data

US 2004/0202264 A1  Oct. 14, 2004

Related U.S. Application Data

(62) Division of application No. 10/388,052, filed on Mar. 12, 2003, now Pat. No. 6,865,135.

(51) Int. Cl.[7] .............................. G11C 8/00; H03L 7/00
(52) U.S. Cl. ...................... 365/233; 365/194; 327/160; 327/161
(58) Field of Search ................................ 327/141, 160, 327/161, 291, 298; 365/194, 233

(56) References Cited

U.S. PATENT DOCUMENTS

| | | | | |
|---|---|---|---|---|
| 5,254,888 | A | 10/1993 | Lee et al. ................... | 327/298 |
| 5,652,536 | A | 7/1997 | Nookala et al. ............ | 327/298 |
| 5,717,353 | A * | 2/1998 | Fujimoto .................... | 327/276 |
| 5,955,904 | A | 9/1999 | Kawasaki ................... | 327/156 |
| 5,964,880 | A | 10/1999 | Liu et al. ................... | 713/401 |
| 5,973,525 | A * | 10/1999 | Fujii .......................... | 327/158 |
| 6,011,732 | A | 1/2000 | Harrison et al. ............ | 365/194 |
| 6,104,228 | A | 8/2000 | Lakshmikumar ............ | 327/407 |
| 6,107,841 | A | 8/2000 | Goodnow .................... | 327/99 |
| 6,111,446 | A | 8/2000 | Keeth ......................... | 327/258 |
| 6,125,157 | A | 9/2000 | Donnelly et al. ........... | 375/371 |
| 6,198,689 | B1 * | 3/2001 | Yamazaki et al. .......... | 365/233 |
| 6,236,251 | B1 | 5/2001 | Akamatsu ................... | 327/144 |
| 6,242,954 | B1 | 6/2001 | Taniguchi et al. .......... | 327/149 |
| 6,323,715 | B1 | 11/2001 | Vatinel ....................... | 327/407 |
| 6,326,826 | B1 | 12/2001 | Lee et al. ................... | 327/161 |

(Continued)

FOREIGN PATENT DOCUMENTS

JP           02190733 A      7/1990    ........... G01M 3/04

OTHER PUBLICATIONS

Jung, Y. et al., "A Dual-Loop Delay-Locked Loop Using Multiple Voltage-Controlled Delay Lines," IEEE Journal of Solid-State Circuits, vol. 36, No. 5, May 2001, pp. 784-791.

*Primary Examiner*—Son Mai
(74) *Attorney, Agent, or Firm*—Dorsey & Whitney LLP

(57) ABSTRACT

An apparatus and method for generating a plurality of synchronizing signals for synchronizing operation of the device in which the apparatus is located, such as in semiconductor memory devices. The apparatus can generate a plurality of synchronizing signals based on a corresponding plurality of input clock signals and select one of the synchronizing signals to be provided as the synchronizing clock signal. Alternatively, the apparatus can generate a plurality of internal clock signals based on an input clock signal, and generate a corresponding plurality of synchronizing signals from the plurality of internal clock signals. One of the synchronizing signals is selected by the apparatus as the synchronizing clock signal. Alternatively, the apparatus can receive a clock signal, generate a synchronized clock signal therefrom, and generate a synchronizing pulse in response to number of periods of the synchronized clock signal, the number based on a selection signal provided to the apparatus.

19 Claims, 6 Drawing Sheets

U.S. PATENT DOCUMENTS

| | | | |
|---|---|---|---|
| 6,327,196 B1 | 12/2001 | Mullarkey | 365/194 |
| 6,333,893 B1 | 12/2001 | Keeth et al. | 365/233 |
| 6,339,553 B1 | 1/2002 | Kuge | 365/194 |
| 6,434,083 B2 | 8/2002 | Lim | 365/233 |
| 6,453,425 B1 | 9/2002 | Hede et al. | 713/501 |
| 6,490,207 B2 * | 12/2002 | Manning | 365/194 |
| 6,552,955 B1 * | 4/2003 | Miki | 365/233 |
| 6,600,345 B1 | 7/2003 | Boutaud | 327/99 |
| 6,621,315 B2 | 9/2003 | Heo et al. | 327/158 |
| 2003/0085744 A1 | 5/2003 | Heo et al. | 327/158 |

* cited by examiner

MULTI-FREQUENCY SYNCHRONIZING CLOCK SIGNAL GENERATOR

CROSS-REFERENCE TO RELATED APPLICATION

This application is a divisional of U.S. patent application Ser. No. 10/388,052, filed Mar. 12, 2003 now U.S. Pat. No. 6,865,135.

TECHNICAL FIELD

The present invention relates generally to integrated circuits, and more specifically to synchronizing an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modern synchronous memories the frequency is in excess of 100 MHz. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another.

FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning (Manning), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKDEL signal corresponds to the internal clock signal.

In the delay-locked loop 100, the variable delay line 102 is typically formed from a number of serially-connected individual delay stages, with individual delay stages being added or removed to adjust the variable delay VD, as will be understood by those skilled in the art. The variable delay line 102 must be able to provide the maximum variable delay VD corresponding to the CLK signal having the lowest frequency in the frequency range over which the delay-locked loop is designed to operate. This is true because the variable delay line 102 must provide a variable delay VD of NTCK−(D1+D2), which will have its largest value when the period of the CLK signal is greatest, which occurs at the lowest frequency of the CLK signal.

As previously explained, the delay-locked loop 100 can only operate over a limited frequency range due to the maximum delay available from the variable delay line 102. In many memory device applications, the minimum frequency that a delay-locked loop can accommodate is one-half the maximum operating frequency of the memory device in which the delay-locked loop is located. For example, a synchronous memory device rated at a maximum clock frequency of 100 MHz typically includes a delay-locked loop having a variable delay line that can accommodate a clock frequency as low as 50 MHz. However, in some instances, it may desirable to be able to operate the device at a frequency less than one-half of the maximum operating frequency, or in the case of the previously mentioned synchronous memory device, at a clock frequency less than 50 MHz.

One such instance is for the purpose of power efficiency. It is generally the case that the higher the clock frequency at which a memory device is operated, the higher the power consumed. However, in some memory device applications, the frequency at which a memory device needs to output data does not necessarily need to be at its maximum operating frequency. Thus, it would be advantageous to be able to operate a memory device at lower clock frequency to take advantage of any power savings that may be available. For the greatest power efficiency, the lowest operating frequency that can be sustained will yield the greatest benefit. For example, in the case of computer graphics applications, a high operating frequency is desirable when data needs to be read from and written to memory quickly, such as when significant computation is necessary in generating pixel information for computer graphics images that are changing rapidly. This is the case for many computer video games where there is motion through a world space defined by three-dimensional geometric information that needs to be translated into a two-dimensional image for display. The ability to access data from memory at a high frequency is critical in creating the impression of smooth motion, and consequently, memory devices should be operating at the maximum clock frequency to facilitate the graphics processing. However, operating the graphics system at a low operating frequency may also be desirable under some circumstances, such as when the images are changing relatively slowly, or only a small portion of the pixels displayed need to be modified each time the image is refreshed. An example of this situation is the case of a screen saver where images remain relatively static until refreshed, or where movement is relatively slow. Under these circumstances, the rate at which data can be accessed from a memory device can be considerably slower, and consequently, operating the memory of the graphics system at a lower frequency than in the situation where high frequency is desirable will yield power savings.

As previously discussed, the rate at which data is provided by the memory device is typically synchronized with the input clock signal, which is generally a fixed frequency clock signal. However, even if the frequency of the input clock signal could be adjusted to a lower frequency, there remains the issue with the limited range of clock frequencies that conventional delay-locked loops can accommodate. As previously discussed, the minimum frequency is often one-half of the maximum operating frequency, which may still be higher than what is desirable under certain conditions. In this situation, to manage power consumption more efficiently, it would be desirable to then operate the memory device at a frequency lower than what is possible with conventional memory devices.

One approach to overcoming the limitation of one-half the maximum operation frequency is to use a delay-locked loop having a variable delay stage with a broader delay range. However, it is also desirable to have a large number of stages in the variable delay line 102 with each stage having an incremental delay to provide better resolution in controlling the value of the variable delay. A consequence of having the desired fine resolution and broad range of variable delay is that it can result in the delay line consisting of a large number of individual delay stages, which will consume a relatively large amount of space on a semiconductor substrate in which the delay-locked loop and other components of the synchronous memory device are formed. Moreover, such a large number of individual delay stages can result in significant power consumption by the delay-locked loop, which may be undesirable particularly in applications where the synchronous memory device is contained in a portable battery-powered device.

SUMMARY OF THE INVENTION

Embodiments of the present invention are directed to a method and apparatus for generating a plurality of synchronizing signals for synchronizing operation of the device in which the apparatus is located, such as in semiconductor memory devices. In one aspect of the invention, the apparatus generates a plurality of synchronizing signals based on a corresponding plurality of input clock signals, and selecting one from the plurality of synchronizing signals to be provided as the synchronizing clock signal. In another aspect of the invention, the apparatus generates a plurality of internal clock signals based on an input clock signal, and further generates a corresponding plurality of synchronizing signals from the plurality of internal clock signals, one of which is selected to be provided as the synchronizing clock signal. In another aspect of the invention, the apparatus receives an input clock signal, generates a synchronized clock signal therefrom, and generates a synchronizing pulse in response to number of periods of the synchronized clock signal. The value of n is selected based on a selection signal provided to the apparatus.

DETAILED DESCRIPTION OF THE INVENTION

Embodiments of the present invention provide a synchronizing circuit that can provide an output clock signal having different frequencies for synchronizing device operation. In some applications, such flexibility can be used to advantageously reduce power consumption by providing different frequency synchronizing clock signals to tailor the timing of device operation to the demands placed on the device. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
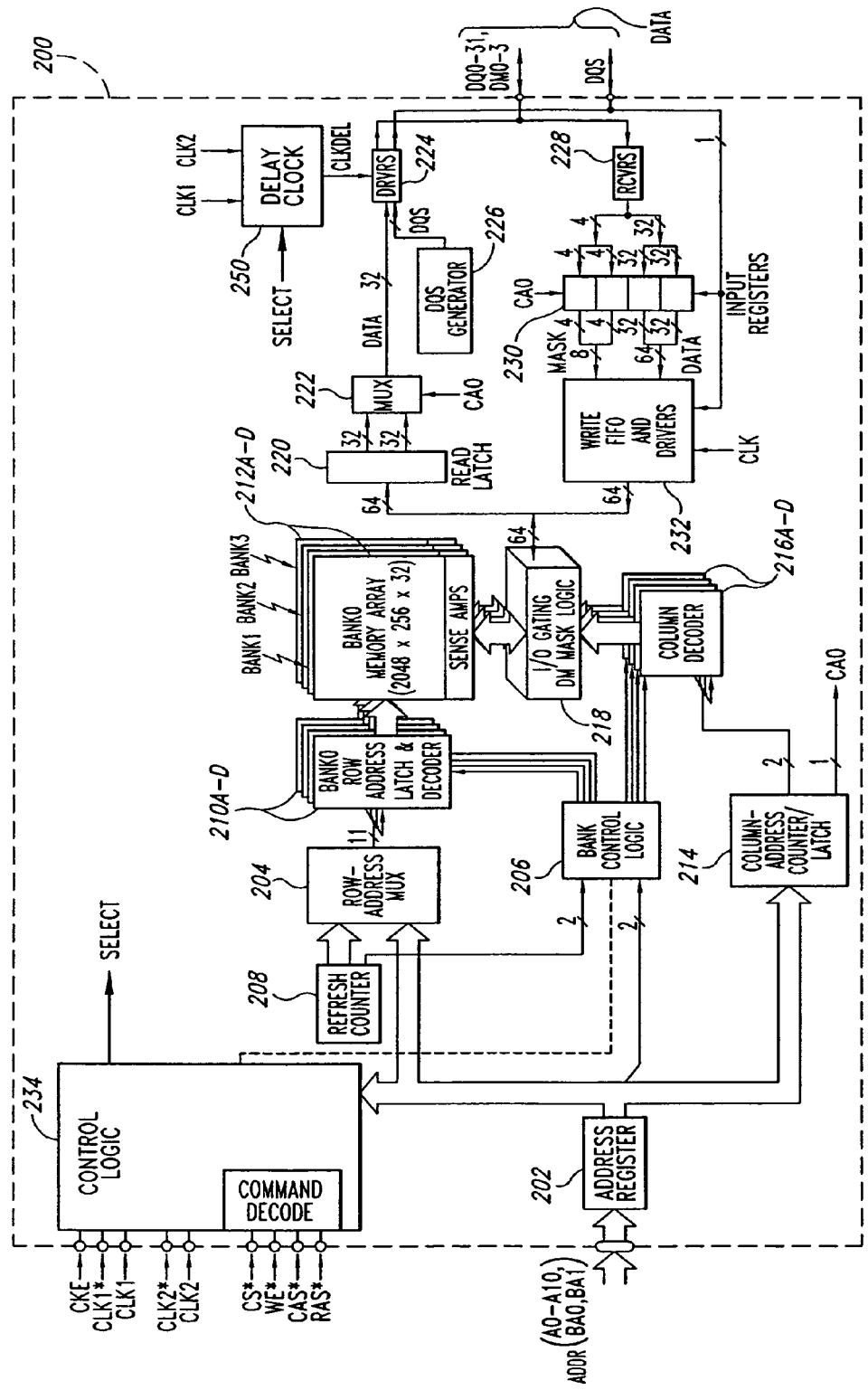
FIG. 2 is a functional block diagram illustrating a synchronous memory device including a delay clock generator according to an embodiment of the present invention.

FIG. 2 is a functional block diagram of a memory device 200 having a delay clock generator 250 according to an embodiment of the present invention. The memory device 200 in FIG. 2 is a double-data rate (DDR) synchronous dynamic random access memory ("SDRAM"), although the principles described herein are applicable to any memory device that may include circuitry for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 200 includes a control logic and command decoder 234 that receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*. The clocking signals include a clock enable signal CKE* and first complementary clock signals CLK1, CLK1*, and second complementary clock signals CLK2, CLK2*, with the "*" designating a signal as being active low. The CLK1 and CLK2 signals have different frequencies, and preferably, the frequency of one of the clock signal is less than one-half the frequency of the other clock signal. As will be explained in more detail below, either the CLK1, CLK1* signals or the CLK2, CLK2* signals can be used to synchronize operation of the memory device 200, the selection of which can be made through the command decoder 234.

The command signals CS*, WE*, CAS*, and RAS* are driven to values corresponding to a particular command, such as a read, write, or auto-refresh command. In response to one of the clocking signals, either CLK1 and CLK1*, or CLK2 and CLK2*, the command decoder 234 latches and decodes an applied command, and generates a sequence of clocking and control signals that control the components 202–232 to execute the function of the applied command. The clock enable signal CKE enables clocking of the command decoder 234 by the clocking signals. The command decoder 234 latches command and address signals at positive edges of the clocking signals (i.e., the crossing point of CLK1 going high and CLK1* going low, or the crossing point of CLK2 going high and CLK2* going low), while the input registers 230 and data drivers 224 transfer data into and from, respectively, the memory device 200 in response to both edges of a data strobe signal DQS. Thus, memory transactions occur at double the frequency of the either the CLK1, CLK1* signals or the CLK2, CLK2* signals because the DQS signal has the same frequency as the selected clocking signals CLK1 or CLK2. The memory device 200 is referred to as a double-data-rate device because the data words DQ being transferred to and from the device are transferred at double the rate of a conventional SDRAM, which transfers data at a rate corresponding to the frequency of the applied clock signals. The detailed operation of the control logic and command decoder 234 in generating the control and timing signals is conventional, and thus, for the sake of brevity, will not be described in more detail.

The memory device 200 further includes an address register 202 that receives row, column, and bank addresses over an address bus ADDR, with a memory controller (not shown) typically supplying the addresses. The address register 202 receives a row address and a bank address that are applied to a row address multiplexer 204 and bank control logic circuit 206, respectively. The row address multiplexer 204 applies either the row address received from the address register 202 or a refresh row address from a refresh counter 208 to a plurality of row address latch and decoders 210A–D. The bank control logic 206 activates the row address latch and decoder 210A–D corresponding to either the bank address received from the address register 202 or a refresh bank address from the refresh counter 208, and the activated row address latch and decoder latches and decodes the received row address. In response to the decoded row address, the activated row address latch and decoder 210A–D applies various signals to a corresponding memory bank 212A–D to thereby activate a row of memory cells corresponding to the decoded row address. Each memory bank 212A–D includes a memory-cell array having a plurality of memory cells arranged in rows and columns, and the data stored in the memory cells in the activated row is stored in sense amplifiers in the corresponding memory bank. The row address multiplexer 204 applies the refresh row address from the refresh counter 208 to the decoders 210A–D and the bank control logic circuit 206 uses the refresh bank address from the refresh counter when the memory device 200 operates in an auto-refresh or self-refresh mode of operation in response to an auto- or self-refresh command being applied to the memory device 200, as will be appreciated by those skilled in the art.

A column address is applied on the ADDR bus after the row and bank addresses, and the address register 202 applies the column address to a column address counter and latch 214 which, in turn, latches the column address and applies the latched column address to a plurality of column decoders 216A–D. The bank control logic 206 activates the column decoder 216A–D corresponding to the received bank address, and the activated column decoder decodes the applied column address. Depending on the operating mode of the memory device 200, the column address counter and latch 214 either directly applies the latched column address to the decoders 216A–D, or applies a sequence of column addresses to the decoders starting at the column address provided by the address register 202. In response to the column address from the counter and latch 214, the activated column decoder 216A–D applies decode and control signals to an I/O gating and data masking circuit 218 which, in turn, accesses memory cells corresponding to the decoded column address in the activated row of memory cells in the memory bank 212A–D being accessed.

During data read operations, data being read from the addressed memory cells is coupled through the I/O gating and data masking circuit 218 to a read latch 220. The I/O gating and data masking circuit 218 supplies N bits of data to the read latch 220, which then applies two N/2 bit words to a multiplexer 222. In the embodiment of FIG. 2, the circuit 218 provides 64 bits to the read latch 220 which, in turn, provides two 32 bits words to the multiplexer 222. A data driver 224 sequentially receives the N/2 bit words from the multiplexer 222 and also receives a data strobe signal DQS from a strobe signal generator 226 and a delayed clock signal CLKDEL from delay clock generator 250. As will be explained in more detail below, the delay clock generator 250 can provide CLKDEL signals of different frequencies such that the memory device 200 can operate at multiple frequencies. As previously discussed, operating the memory device 200 at different frequencies may provide benefits in power efficiency. In the present embodiment, the delay clock generator 250 generates the CLKDEL signal from the CLK1, CLK1* signals or the CL2, CLK2* signals. Thus, unlike conventional memory devices, the memory device 200 can operate at either a maximum operating frequency or at a clock frequency less than one-half of its maximum operating frequency.

The DQS signal is used by an external circuit such as a memory controller (not shown) in latching data from the memory device 200 during read operations. In response to the delayed clock signal CLKDEL, the data driver 224 sequentially outputs the received N/2 bits words as a corresponding data word DQ, each data word being output in synchronism with a rising or falling edge of a CLK signal that is applied to clock the memory device 200. The data driver 224 also outputs the data strobe signal DQS having rising and falling edges in synchronism with rising and falling edges of the selected clocking signal, respectively. Each data word DQ and the data strobe signal DQS collectively define a data bus DATA. As will be appreciated by those skilled in the art, the CLKDEL signal from the delay clock generator 250 is a delayed version of either the CLK1 signal or the CLK2 signal, and the delay clock generator 250 adjusts the delay of the CLKDEL signal relative to the selected clocking signal to ensure that the DQS signal and the DQ words are placed on the DATA bus in synchronism with that clocking signal. The DATA bus also includes masking signals DM0–M, which will be described in more detail below with reference to data write operations.

During data write operations, an external circuit such as a memory controller (not shown) applies N/2 bit data words DQ, the strobe signal DQS, and corresponding data masking signals DM0–X on the data bus DATA. A data receiver 228 receives each DQ word and the associated DM0–X signals, and applies these signals to input registers 230 that are clocked by the DQS signal. In response to a rising edge of the DQS signal, the input registers 230 latch a first N/2 bit DQ word and the associated DM0–X signals, and in response to a falling edge of the DQS signal the input registers latch the second N/2 bit DQ word and associated DM0–X signals. The input register 230 provides the two latched N/2 bit DQ words as an N-bit word to a write FIFO and driver 232, which clocks the applied DQ word and DM0–X signals into the write FIFO and driver in response to the DQS signal. The DQ word is clocked out of the write FIFO and driver 232 in response to either the CLK1 or CLK2 signal, and is applied to the I/O gating and masking circuit 218. The I/O gating and masking circuit 218 transfers the DQ word to the addressed memory cells in the accessed bank 212A–D subject to the DM0–X signals, which may be used to selectively mask bits or groups of bits in the DQ words (i.e., in the write data) being written to the addressed memory cells.

It will be appreciated that the memory device 200 illustrated in FIG. 2 is provided by way of example, and various minor modifications can be made without departing from the scope of the present invention.

Figure 3:
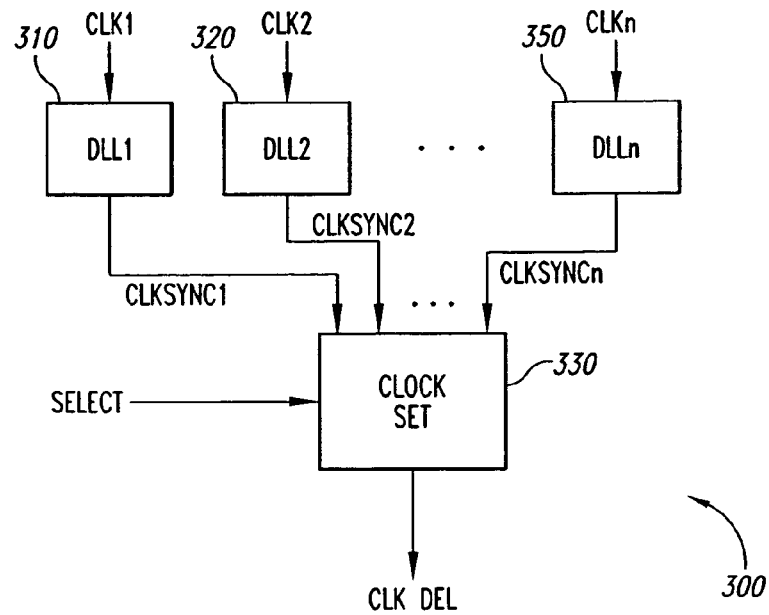
FIG. 3 is a functional block diagram of a delay clock generator according to an embodiment of the present invention.

FIG. 3 illustrates a delay clock generator 300 according to an embodiment of the present invention that can be substituted for the delay clock generator 250 in FIG. 2. The delay clock generator 300 includes a plurality of DLLs, including a first DLL 310 that receives a first clock signal CLK1 and a second DLL 320 that receives a second clock signal CLK2. A DLL 350 represents the nth DLL and receives a CLKn signal. The DLLs 310, 320, 350 are conventional. The delay clock generator 300 will be described with respect to the first and second DLLs 310, 320 since it will be appreciated by those ordinarily skilled in the art that some or all of the principles described herein can be applied to a delay clock generator having any number of DLLs and remain within the scope of the present invention.

The first DLL 310 generates a first output clock signal CLKSYNC1 that is provided to a clock select circuit 330, and the second DLL 320 generates and provides a second output clock signal CLKSYNC2 to the clock select circuit 330. One of the CLKSYNC1 and CLKSYNC2 signals is selected to be provided as the CLKDEL signal to the data driver 224 (FIG. 2) based on the selection signal SELECT, which is provided to the clock select circuit 330 by the control logic 234. It will be appreciated by those ordinarily skilled in the art that the DLLs 310 and 320 can be replaced by other well known synchronizing circuits, such as phase-locked loops and synchronous mirror delays, without departing from the scope of the present invention.

Operation of the delay clock generator 300 will be explained with respect to the signal timing diagram of FIG. 4. In operation, the delay clock generator 300 can provide a CLKDEL signal that is based on either the CLK1 signal or the CLK2 signal. As previously discussed, the CLK1 and CLK2 signals have different frequencies, and in one embodiment, the frequency of one of the clock signals is less than one-half of the frequency of the other clock signal. In this manner, the memory device 200 (FIG. 2) can be operated according to two different clock frequencies that could not otherwise be accommodated in a conventional memory device. For example, in conventional devices, a typical frequency range for an input clock signal is between 75 MHz and 167 MHz. However, with embodiments of the present invention, the range of acceptable clock frequencies can include the conventional range of 75 MHz–167 MHz, and additionally cover clock signals less than 75 MHz. Even as input clock frequencies increase to greater than those now typical, that is, greater than 167 MHz, embodiments of the present invention can still accommodate clock frequencies less than 75 MHz at the same time.

It will be appreciated by those of ordinary skill in the art that the frequency of the input clock signal provided to the memory device is not necessarily the same as the frequency of the clock signals applied to the delay clock generator. For example, in the case of DDR memory devices, the frequency of the synchronizing signal generated by the delay clock generator will be roughly twice as fast as the frequency of the input clock signal.

Figure 4:
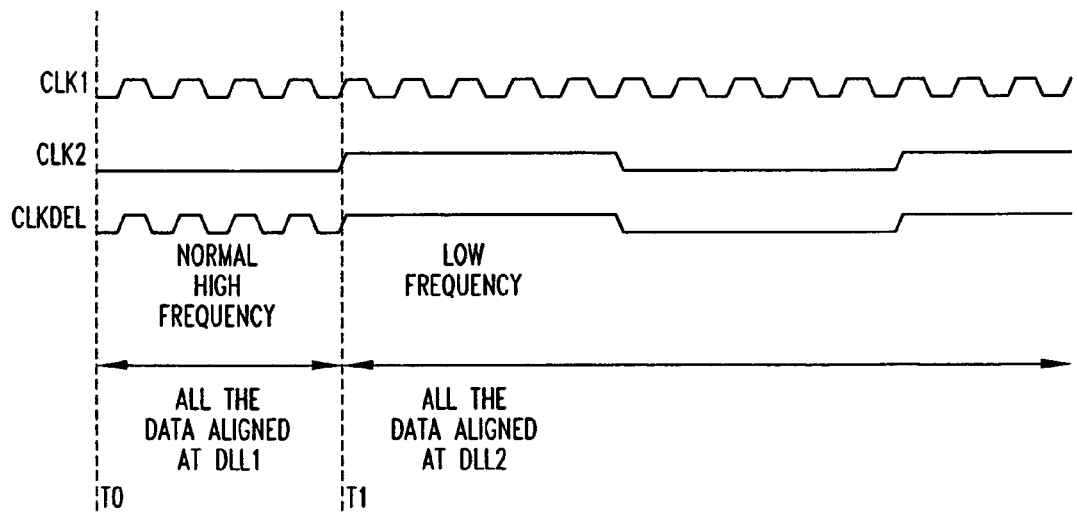
FIG. 4 is a signal timing diagram illustrating various signals generated during operation of the delay clock generator of FIG. 3.

As shown in FIG. 4, the CLK1 signal has a frequency that is about ten times that of the CLK2 signal. As previously discussed, conventional memory devices cannot typically accommodate clock signals having a frequency less than one-half of the maximum clock frequency at which the memory device can be operated. However, the memory device 200 can operate in synchronicity with either the CLK1 signal or the CLK2 signal because the delay clock generator 300 includes the first DLL 310 and the second DLL 320. With reference to FIG. 4, at a time T0, the memory device 200 is operating according to the CLK1 signal, that is, at relatively high frequency. Data transactions with the memory device 200 are all synchronized with the CLK1 signal because the DLL 310 is active, and the clock select circuit 330 is providing the CLKSYNC1 signal as the CLKDEL signal. As previously discussed, operation at high frequency is desirable when data transactions with the memory device 200 occur frequently, such as when the memory device 200 is involved in the computation of a high volume of computer graphics data.

In contrast, at a time T1, the clock signal used by the memory device 200 to synchronize data transactions is switched to the CLK2 signal, which has a relatively low frequency in comparison with the CLK1 signal. The DLL 320 is activated, and the command decoder 234 (FIG. 2) generates a SELECT signal to instruct the clock select circuit 320 to provide the CLKSYNC2 signal as the CLKDEL signal to synchronize data transactions with the memory device 200. Generation of the SELECT signal is well understood in the art, and will not be described in detail herein in the interest of brevity. In one embodiment of the present invention, the SELECT signal is generated by the command decoder 234 in response to receiving command signals to switch to a second clock signal. In another embodiment, the SELECT signal is generated by the command decoder automatically in response to detecting an active clock signal applied to the respective clock terminal. In another embodiment, the SELECT signal is generated in response to the type of operation the memory device 200 is performing. The various conditions under which the SELECT signal is generated can be applied to all embodiments of the present invention described herein, and it will be appreciated, that the circumstances under which the SELECT signal is generated can vary, and yet still remain within the broad scope of the present invention.

As previously discussed, the lower frequency of the CLK2 signal can be used in situations where data transactions with the memory device 200 do not need to be as frequent, such as in computer graphics imaging when only background images need to be updated. As a result of the memory device 200 operating at the slower frequency, and consequently, reducing the frequency of the memory transactions, the memory device 200 will consume less average power. Although not shown in FIG. 4, the delay clock generator 300 can be switched back and forth between providing CLKSYNC1 (i.e., CLK1) and CLKSYNC2 (i.e., CLK2) as the CLKDEL, which reduces the overall power consumption of the memory device 200.

It will be appreciated that the first and second DLLs 310, 320 will be tailored to the input and output delays associated with the circuitry through which the CLK1 and CLK2 signals propagate, as well as the desired frequency of the CLK1 and CLK2 signals. That is, the additional propagation delay inherent with clock select circuit 330 will be accommodated by the DLLs 310 and 320 in order to synchronize memory transactions of the memory device 800 to the respective clock signal. Additionally, as previously discussed with respect to conventional DLLs, the DLLs 310 and 320 will each be limited to a frequency range due to the amount of delay provided by the respective variable delay lines. Consequently, the variable delay lines of each DLL 310 and 320 should be tailored for the frequency of the CLK1 and CLK2 signals.

Figure 5:
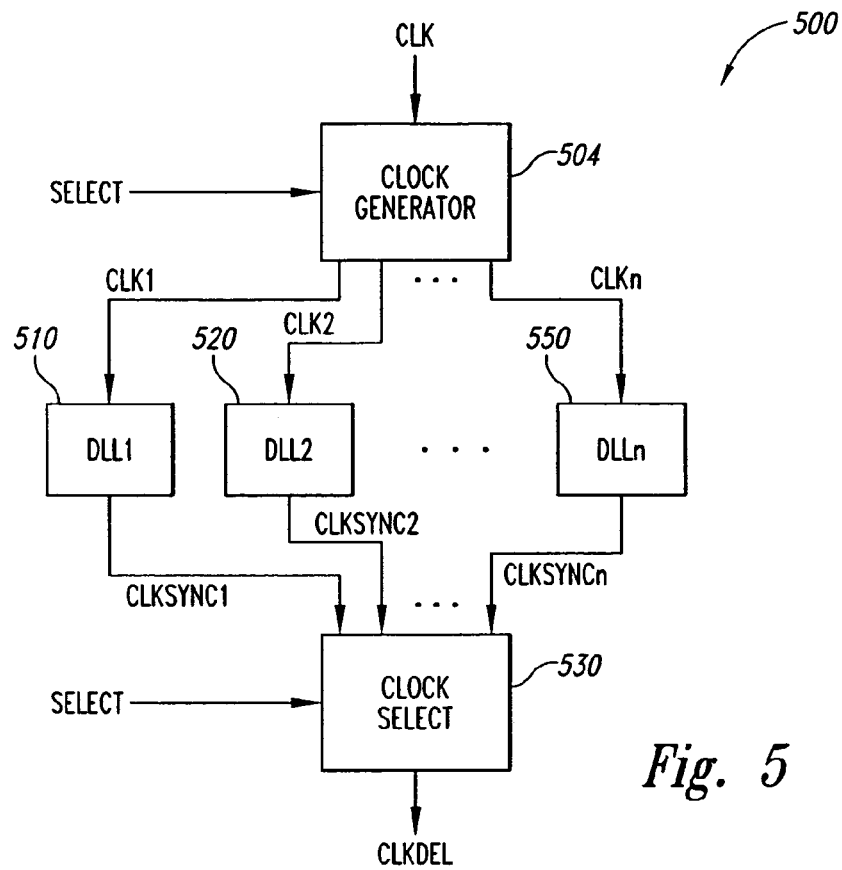
FIG. 5 is a functional block diagram of a delay clock generator according to another embodiment of the present invention.

FIG. 5 illustrates a delay clock generator 500 according to another embodiment of the present invention that can be substituted for the delay clock generator 250 of the memory device 200 (FIG. 2). The delay clock generator 500 includes a clock generator 504 that is capable of generating a plurality of clock signals, including a first clock signal CLK1, a second clock signal CLK2, and an nth clock signal CLKn from an input clock signal CLK. Selection of which of the plurality of output clock signals to generate is made by a selection signal SELECT. It will be appreciated by those ordinarily skilled in the art that with the delay clock generator 500, the memory device 200 can receive one clock signal CLK rather than multiple clock signals CLK1 and CLK2. The delay clock generator 500 provides the advantage over the delay clock generator 300 in that the memory device 200 does not need multiple clock terminals for operation, which may be a concern where it is desirable to reduce the number of memory device terminals. At least two of the clock signals generated by the clock generator 504 have different clock frequencies. In the present embodiment, the CLK1 and CLK2 signals have different clock frequencies, and in one embodiment, the frequency of one clock signal is less than one-half of the other clock signal. As described with respect to the delay clock generator 300 (FIG. 3), embodiments of the present invention can cover the range of acceptable input clock frequencies, such as 75 MHz–167 MHz, and also accommodate input clock frequencies less than 75 MHz, even if the acceptable frequencies of input clock signals increase to greater than 167 MHz.

The clock signals generated by the clock generator 504 are provided to a respective DLL. As shown in FIG. 5, the CLK1 signal is provided to a first DLL 510, the CLK2 signal is provided to a second DLL 520, and the CLKn signal is provided to an nth DLL 550. As with the embodiment of the delay clock generator 300 shown in FIG. 3, the DLLs are conventional. The delay clock generator 500 will be described with respect to the first and second DLLs 510, 520 since it will be appreciated by those ordinarily skilled in the art that some or all of the principles described herein can be applied to a delay clock generator having any number of DLLs and remain within the scope of the present invention.

Each of the DLLs 510 and 520 generate a respective CLKSYNC signal, which are provided to a clock select circuit 530. The clock select circuit 530, in turn, provides either the CLKSYNC1 signal or the CLKSYNC2 signal as the CLKDEL signal for synchronizing memory transactions with the memory device 200 based on the SELECT signal. As previously discussed, generation of the SELECT signal by the command decoder 234 (FIG. 2) is conventional and well known in the art. The delay clock generator 500 can be used to provide a CLKDEL that enables the memory device 200 to be operated at two different clock frequencies, which as previously discussed, may be desirable under certain operating conditions for the purpose of reducing average power consumption.

Figure 6:
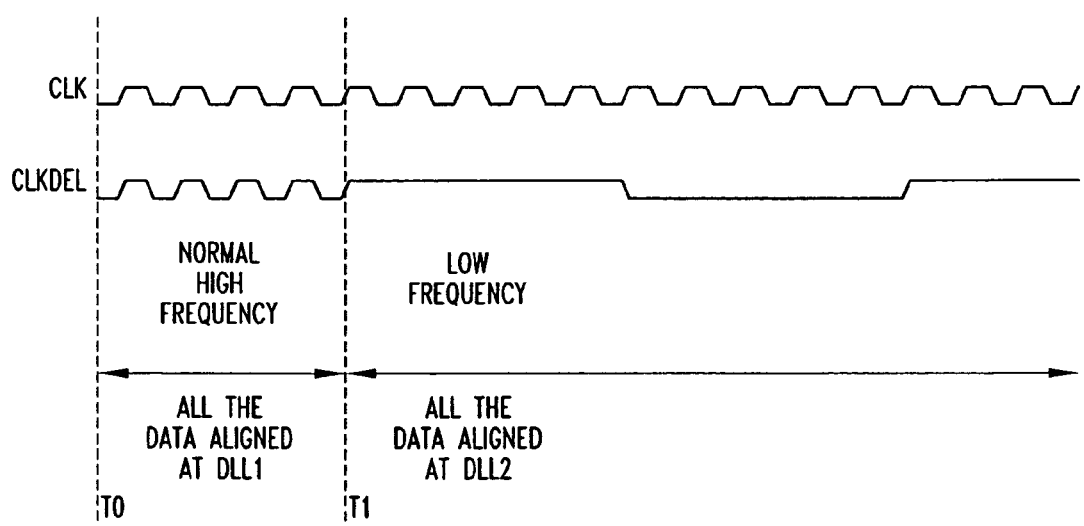
FIG. 6 is a signal timing diagram illustrating various signals generated during operation of the delay clock generator of FIG. 5.

FIG. 6 is a signal timing diagram illustrating the CLKDEL signal provided by the delay clock generator 500 of FIG. 5. At a time T0, the clock generator 504 is generating a relatively high clock signal. For the sake of providing an example, the CLK1 signal will be assumed to have a relatively high frequency. The CLK1 signal is provided to the first DLL 510, which in turn generates the CLKSYNC1 signal that will be used as the CLKDEL signal to synchronize the memory transactions with the memory device 200. At a time T1, the SELECT signal is switched to instruct the clock generator 504 to generate the CLK2 signal, which in the present example has a relatively low frequency, and further instructs the clock select circuit 530 to provide the CLKSYNC2 signal output by the DLL 520 as the CLKDEL signal. As shown in FIG. 6, the CLK signal provided to the memory device 200 remains at a constant frequency, but the CLKDEL signal can be switched between two different frequencies to synchronize memory transactions.

Figure 7:
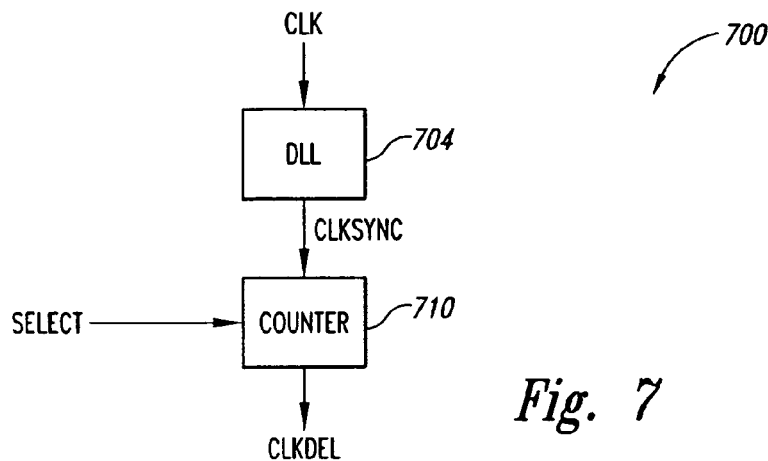
FIG. 7 is a functional block diagram of a delay clock generator according to another embodiment of the present invention.

FIG. 7 illustrates a delay clock generator 700 according to another embodiment of the present invention that can be substituted for the delay clock generator 250 (FIG. 2). The delay clock generator 700 includes a DLL 704 coupled to receive the clock signal CLK. As with the delay clock generator 500 of FIG. 5, only one clock signal CLK is required, thereby avoiding the need for the memory device 200 to receive two separate clock signals. The DLL 704 generates an output signal CLKSYNC that is provided to a counter circuit 710. The counter circuit 710, in turn, generates a CLKDEL signal used by the memory device to synchronize memory transactions. Based on the selection signal SELECT, the counter circuit 710 can output CLKDEL signals at different time intervals to effectively operate the memory device 200 at different frequencies. The counter circuit 710 accomplishes this by counting the number of CLKSYNC pulses it receives, and outputting a CLKDEL signal after a specific number of CLKSYNC pulses has been received. For example, the SELECT signal can instruct the counter circuit 710 to output a CLKDEL signal for every 16 cycles of the CLKSYNC signal. As a result, the frequency at which the memory transactions occur is reduced to one-sixteenth of the frequency of the CLKSYNC signal (i.e., the CLK signal). In an alternative embodiment, the counter circuit 710 is replaced with alternative circuitry capable of generating a CLKDEL signal having a frequency that is less than that of the CLKSYNC signal. There are many well known circuits that can provide the previously described functionality, for example, a conventional frequency divider circuit can be used in place of the counter 710 to provide a CLKDEL signal have a reduced frequency relative to the CLKSYNC signal. Such modifications can be made, and still remain within the scope of the present invention.

Figure 1:
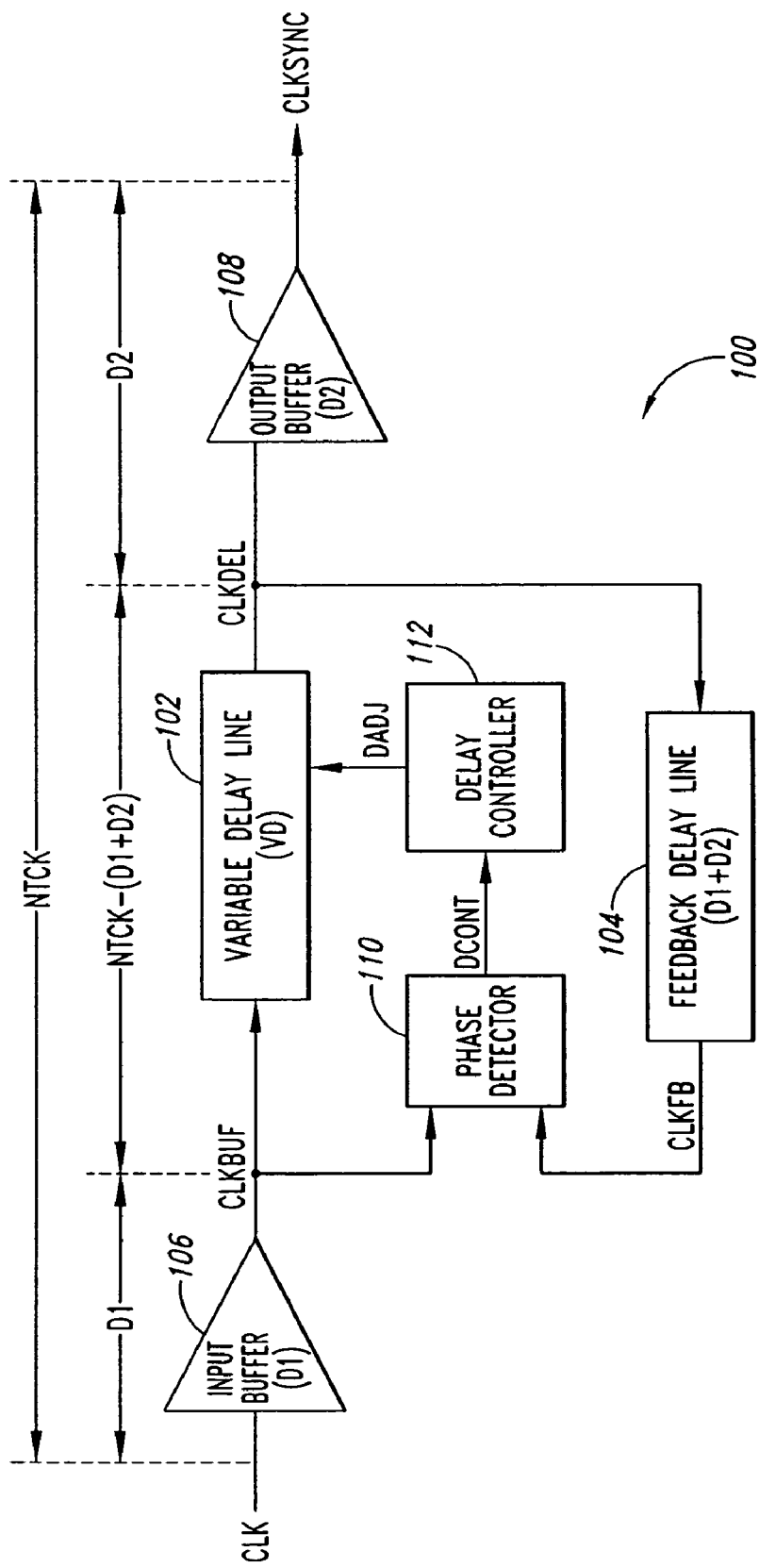
FIG. 1 is a functional block diagram of a conventional delay-locked loop.
Figure 8:
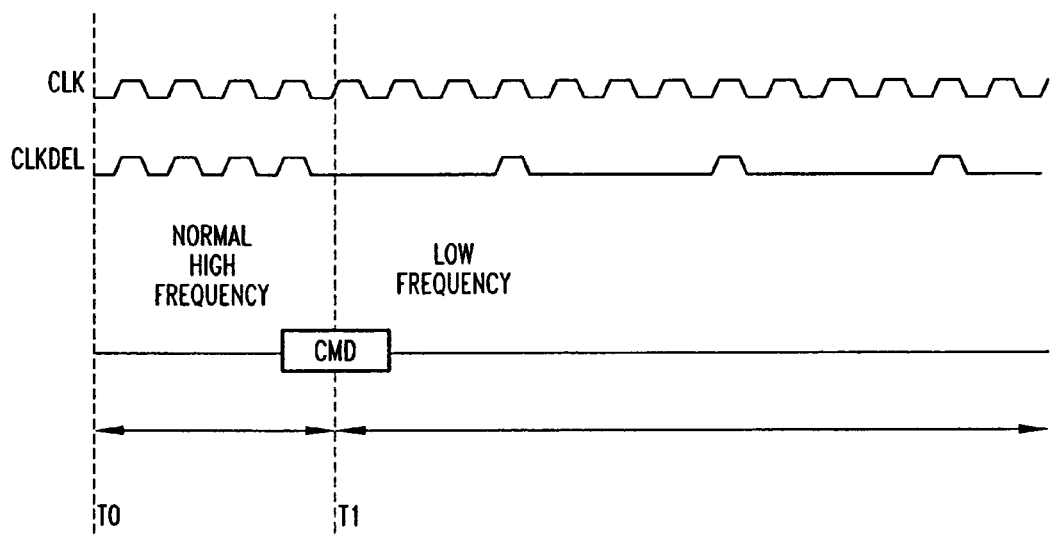
FIG. 8 is a signal timing diagram illustrating various signals generated during operation of the delay clock generator of FIG. 7.

FIG. 8 is a timing diagram illustration of various signals with respect to the operation of the delay clock generator 700 of FIG. 7. At a time T0, the memory device 200 is operating at a relatively high frequency, which is generally, the same frequency as the CLK signal. During this time, the counter circuit 710 is set by a selection signal SELECT to generate the CLKDEL signal having essentially the same frequency as the CLK signal by outputting a CLKDEL signal having a one-to-one correspondence with the CLKSYNC signal. Consequently, the memory transactions of the memory device 200 will be synchronized according to the frequency of the CLK signal. At a time T1, the memory device 200 receives command signals to switch the frequency of operation from the frequency of the CLK signal to a second reduced frequency. The command signals are received by the command decoder 234 (FIG. 1) and in response, a SELECT signal is generated that is provided to the counter circuit 710 to set the number of CLKSYNC pulses that are counted before one CLKDEL pulse is generated in response. Consequently, following the time T1, the memory device 200 will operate at a reduced frequency, and memory transactions will be synchronized accordingly.

It will be appreciated that the description of some details have been omitted in an effort to avoid obscuring the invention. However, the description provided herein is sufficient to enable those ordinarily skilled in the art to practice the invention. For example, with respect to the delay clock generator 300, the first and second DLLs 310, 320 should be tailored for the input and output delays associated with the circuitry through which the CLK1 and CLK2 signals propagate, and for the desired frequency of the CLK1 and CLK2 signals. That is, the additional propagation delay inherent with clock select circuit 330 will be accommodated by the DLLs 310 and 320 in order to synchronize memory transactions of the memory device 800 to the respective clock signal. Additionally, as previously discussed with respect to conventional DLLs, the DLLs 310 and 320 will each be limited to a frequency range due to the amount of delay provided by the respective variable delay lines. Consequently, the variable delay lines of each DLL 310 and 320 should be tailored for the frequency of the CLK1 and CLK2 signals. Such details can be resolved by those having ordinary skill in the art, and consequently, a detailed description has not been provided herein.

It will be further appreciated by those ordinarily skilled in the art that various modifications can be made to the previously described embodiments without departing from the scope of the present invention. For example, although the previously described embodiments of the present invention provide CLKDEL signals having one of two different frequencies, it will be appreciated that other embodiments of the present invention can provide synchronizing signals having several different frequencies. With respect to the delay clock generator 300 (FIG. 3), additional clock signals should be provided to the memory device 200, and a corresponding number of DLLs should be included in the memory device 200 as well. The clock select circuit 330 should also be modified to allow selection from more than merely two signals. With respect to the delay clock generator 500 (FIG. 5), the clock generator 504 would need to be modified to generate additional clock signals, and a corresponding number of DLLs would need to be included for each additional clock signal. As with the clock delay generator 300, the clock select circuit 530 will also need to be modified to allow for the selection from a greater number of CLKSYNC signals. The previously described modifications are well within the understanding of those ordinarily skilled in the art, and can be implemented using conventional circuitry.

Other alternative embodiments replace the DLL of the previously described embodiments with other synchronizing circuits that provide the same functionality of the DLL. For example, phased-locked loops (PLLs) and synchronous mirror delays (SMDs), which are well known in the art, can be substituted for the DLLs. It will be appreciated that such modifications can be made and remain within the scope of the present invention.

It will be further appreciated that although embodiments of the present invention have been described with respect to memory device applications, embodiments of the present invention can be employed in any device where multiple operating frequencies are desired. Additionally, embodiments of the present invention can be used in a memory device for applications other than for synchronizing memory transactions, as previously described.

Figure 9:
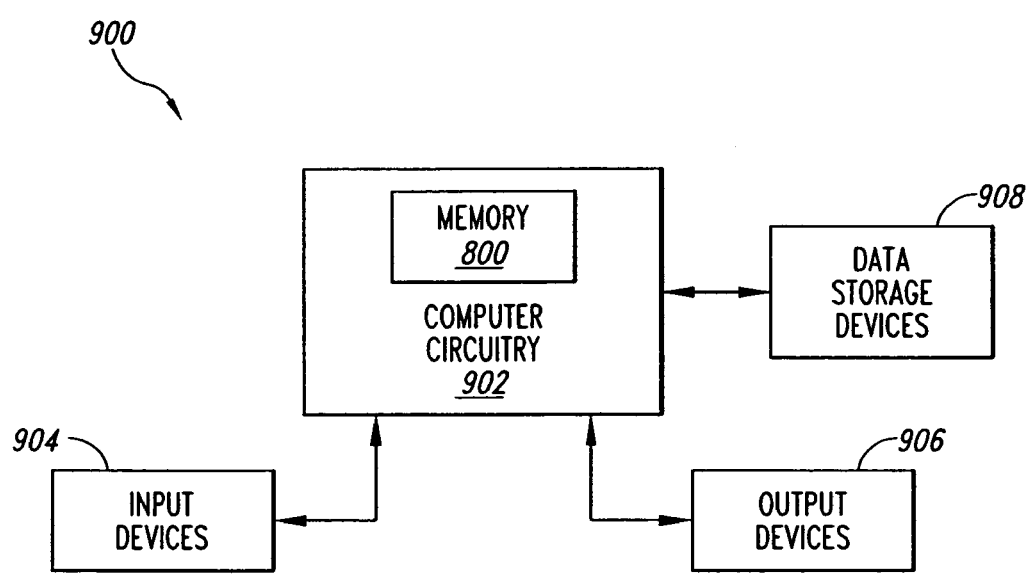
FIG. 9 is a functional block diagram illustrating a computer system including a synchronous memory device of FIG. 2.

FIG. 9 is a block diagram of a computer system 900 including computer circuitry 902 including the memory device 200 of FIG. 2. Typically, the computer circuitry 902 is coupled through address, data, and control buses to the memory device 200 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both, and also, where appropriate, may be realized through software executing on suitable processing circuitry. Accordingly, the invention is not limited except as by the appended claims.

What is claimed is:

1. A synchronizing clock signal generator for generating a synchronizing signal, comprising:
    a synchronizing circuit having an input clock terminal to which an input clock signal having a clock frequency is applied and further having an output clock terminal at which a synchronizing clock signal is provided, the synchronizing clock signal generated by the synchronizing circuit from the input clock signal; and
    a pulse generator having an input coupled to the output clock terminal, an output terminal at which the synchronizing signal is provided, and a selection terminal at which a selection signal is applied, the pulse generator generating the synchronizing signal from the synchronizing clock signal having a pulse repetition frequency based on the selection signal.

2. The synchronizing clock signal generator of claim 1 wherein the synchronizing circuit comprises a delay-locked loop.

3. The synchronizing clock signal generator of claim 1 wherein the synchronizing circuit comprises a synchronous mirror delay.

4. The synchronizing clock signal generator of claim 1 wherein the pulse generator generates a first output synchronizing signal as the synchronizing signal having a first pulse repetition frequency and further generates a second output synchronizing signal as the synchronizing signal having a second pulse repetition frequency that is less than one-half of the first pulse repetition frequency.

5. The synchronizing clock signal generator of claim 4 wherein the first output synchronizing signal has the same frequency and phase as the input clock frequency.

6. The synchronizing clock signal generator of claim 1 wherein the pulse generator comprises a counter circuit generating the synchronizing signal in response to counting n periods of the synchronizing clock signal, the value of n based on the selection signal.

7. The synchronizing clock signal generator of claim 1 wherein the pulse generator comprises a frequency divider generating the synchronizing signal having a frequency that is ($\frac{1}{2}^n$) of the frequency of the synchronizing clock signal, the value of n based on the selection signal.

8. A memory device, comprising:
    an address bus;
    a control bus;
    a data bus;
    an address decoder coupled to the address bus;
    a read/write circuit coupled to the data bus;
    a control circuit coupled to the control bus;
    a memory-cell array coupled to the address decoder, control circuit, and read/write circuit; and
    a synchronizing clock signal generator for generating an output synchronizing signal, comprising:
        a synchronizing circuit having an input clock terminal coupled to receive an input clock signal having a clock frequency and further having an output clock terminal at which a synchronizing clock signal is provided, the synchronizing clock signal generated by the synchronizing circuit from the input clock signal; and
        a pulse generator having an input coupled to the output clock terminal, an output terminal at which the output synchronizing signal is provided, and a selection terminal at which a selection signal is applied, the pulse generator generating the output synchronizing signal from the synchronizing clock signal having a pulse repetition frequency based on the selection signal.

9. The memory device of claim 8 wherein the synchronizing circuit of the synchronizing clock signal generator comprises a delay-locked loop.

10. The memory device of claim 8 wherein the synchronizing circuit of the synchronizing clock signal generator comprises a synchronous mirror delay.

11. The memory device of claim 8 wherein the pulse generator of the synchronizing clock signal generator generates a first output synchronizing signal having a first pulse repetition frequency and further generates a second output synchronizing signal having a second pulse repetition frequency that is less than one-half of the first pulse repetition frequency.

12. The memory device of claim 11 wherein the first output synchronizing signal has the same frequency and phase as the input clock frequency.

13. The memory device of claim 8 wherein the pulse generator of the synchronizing clock signal generator comprises a counter circuit generating an output synchronizing signal in response to counting n periods of the synchronizing clock signal, the value of n based on the selection signal.

14. The memory device of claim 8 wherein the pulse generator of the synchronizing clock signal generator comprises a frequency divider generating an output synchronizing signal having a frequency that is ($½^n$) of the frequency of the synchronizing clock signal, the value of n based on the selection signal.

15. The memory device of claim 8, further comprising an output data driver coupled to the data bus and further coupled to the synchronizing clock signal generator to receive the output synchronizing signal, the output data driver synchronizing the output of data from the memory device based on the output synchronizing signal.

16. A method for generating a synchronizing signal, comprising:
   receiving an input clock signal having a frequency;
   generating a synchronized clock signal; and
   generating a synchronizing pulse in response to n periods of the synchronized clock signal, including generating a first synchronizing pulse having a first pulse repetition frequency and generating a second synchronizing pulse having a second pulse repetition frequency that is less than one-half of the first pulse repetition frequency, the value n selected based on a selection signal.

17. The method of claim 16 wherein generating a synchronized clock signal comprises generating a synchronized clock signal having the same frequency as the input clock signal.

18. The method of claim 16 wherein generating a synchronized clock signal comprises providing the input clock signal to a delay-locked loop, the delay-locked loop providing the synchronized clock signal.

19. The method of claim 16 wherein generating a synchronized clock signal comprises providing the input clock signal to a synchronous mirror delay, the synchronous mirror delay providing the synchronized clock signal.

* * * * *